US008198642B2

(12) United States Patent
Wang et al.

(10) Patent No.: US 8,198,642 B2
(45) Date of Patent: Jun. 12, 2012

(54) LIGHT EMITTING DIODE APPARATUS

(75) Inventors: David Shau Chew Wang, Taipei (TW); Jyh Ming Yu, Kaohsiung (TW)

(73) Assignee: Polytronics Technology Corp. (TW)

( * ) Notice: Subject to any disclaimer, the term of this patent is extended or adjusted under 35 U.S.C. 154(b) by 451 days.

(21) Appl. No.: 11/656,224

(22) Filed: Jan. 19, 2007

(65) Prior Publication Data

US 2008/0111505 A1 May 15, 2008

(30) Foreign Application Priority Data

Nov. 13, 2006 (TW) ............................... 95141860 A

(51) Int. Cl.
*H01L 33/00* (2010.01)

(52) U.S. Cl. ................................. 257/88; 257/E33.055

(58) Field of Classification Search .................... 257/48, 257/79, 80, 81, 82, 84, 88, 89, 90
See application file for complete search history.

(56) References Cited

U.S. PATENT DOCUMENTS

| | | | | |
|---|---|---|---|---|
| 6,064,078 | A * | 5/2000 | Northrup et al. | 257/96 |
| 2002/0003700 | A1 * | 1/2002 | Selkee | 362/249 |
| 2006/0163589 | A1 * | 7/2006 | Fan et al. | 257/88 |

FOREIGN PATENT DOCUMENTS

| | | |
|---|---|---|
| CN | 2767820 Y | 3/2006 |
| TW | 229946 | 3/2005 |
| TW | 249964 | 2/2006 |
| TW | 291087 | 5/2006 |

OTHER PUBLICATIONS

Taiwan Office Action dated Nov. 26, 2010.
English Abstracts of CN 2767820 Y, TW 229946, TW 249964 & TW 291087.

* cited by examiner

*Primary Examiner* — Ha Tran T Nguyen
*Assistant Examiner* — Kevin Quinto
(74) *Attorney, Agent, or Firm* — Seyfarth Shaw LLP

(57) ABSTRACT

A light emitting diode (LED) apparatus with temperature control and current regulation functions is provided. The LED apparatus includes at least one LED die and at least one temperature control and current regulation (TCCR) device. The TCCR device is electrically connected between the LED die and a power source, and is placed within an effective temperature sensing distance of the LED die, so as to sense temperature changes of the LED die. The resistance of the TCCR device is proportional to the temperature in a range of 25° C. to 85° C., i.e., the resistance increases with temperature. Moreover, the resistance difference of the TCCR device between 50° C. and 80° C. is greater than or equal to 100 mΩ.

5 Claims, 6 Drawing Sheets

LIGHT EMITTING DIODE APPARATUS

BACKGROUND OF THE INVENTION (A) Field of the Invention

The present invention relates to a light emitting diode (LED) apparatus, and more particularly to an LED apparatus with temperature control and current regulation functions.

(B) Description of the Related Art

In recent years, white LEDs have become a very popular new product attracting widespread attention all over the world. Because white LEDs offer the advantages of small size, low power consumption, long life, and quick response speed, the problems of conventional incandescent bulbs can be solved. Therefore, the applications of LEDs in backlight sources of displays, mini-projectors, illumination, and car lamp sources are becoming increasingly important in the market.

Although LEDs represent the future of illumination applications, many problems still remain unsolved. For example, with a high power LED for illumination, only about 15-20% of input power is converted into light, and the remaining 80-85% is converted into heat. If the heat is not dissipated to the environment efficiently, the temperature of the LED die will be too high, thus influencing the light emitting intensity and service life of the LED die.

FIG. 1 shows the current, voltage, and temperature conditions of a single LED die when an operation voltage of 4V and current of 1.8 A are applied. After applying such voltage and current, the temperature of the LED die rises from 30° C. to 80° C. in 10 minutes, and will continue to rise, eventually causing the LED to over-heat.

Conventionally, in order to solve the problem of overheating of the LED die, a resistor is serially connected. However, being less sensitive to temperature change, the resistor has neither temperature-sensing nor current-regulation functions, so that the effect is not satisfactory, and cannot provide a stable current within a safe range to protect the LED die.

Moreover, the light emission patterns of red (R), green (G), and blue (B) LED dies are different at high and low temperatures, so the difference in temperature will lead to unexpected R, G, and B color differences, causing color distortion due to imprecise mixing of the three colors. Conventionally, current limiting for the LED die is performed with a power IC to prevent battery overheating, and the color difference is modified depending on a color compensation circuit and a control IC. However, the power IC, the color compensation circuit, and the control IC techniques are complicated and expensive; thus creating a limitation to the popularity of the application of LEDs.

In view of the above, it is crucial for the popularity of LEDs to solve the problems of heat generation and color difference of the emitted light in LED applications.

SUMMARY OF THE INVENTION

The present invention is directed to providing an LED apparatus, which uses a temperature control and current regulation (TCCR) device to prevent problems of over-current and over-temperature, and to prevent the problem of color difference of light emitted by the LED.

The present invention discloses an LED apparatus, which comprises at least one LED die and at least one TCCR device. The TCCR device is electrically connected in series between the LED die and a power source, and is placed within an effective temperature sensing distance of the LED die, so as to sense temperature variations of the LED die. The resistance of the TCCR device is proportional to the temperature within a range of 25° C. to 85° C.; i.e., the resistance increases with temperature. Moreover, the difference between the resistance at 50° C. and the resistance at 80° C. of the TCCR device is greater than or equal to 100 mΩ.

The TCCR device is an analog device capable of detecting heat generated by the serially connected LED die. As a result, when the temperature of the LED die increases, the temperature of the TCCR device also increases as it senses the increasing temperature of the LED, and the resistance or the TCCR device increases accordingly. Thus, the current flowing through the LED die is reduced, so as to prevent the LED die from damage by overheating, and further to achieve the purposes of temperature control and current regulation.

Because the resistance of a conductive composite material having the characteristic of positive temperature coefficient (PTC) is maintained at a low level while operating at normal temperatures, circuits or devices connected in series with a PTC device can operate normally. However, when over-current or over-temperature of circuits or batteries occurs, the resistance of the PTC device instantly increases to a state of high resistance (at least above $10^4$ ohm), i.e., a trip. Before tripping, the resistance of the PTC device rises slowly with increases of temperature. Accordingly, in a preferred embodiment of the present invention, a PTC material is used in the TCCR device, and the PTC device can be made by adding a conductive filler (e.g., carbon black, metal powder, or conductive ceramic powder) to a polymer or made of a PTC ceramic material.

The TCCR device of the present invention operates in a range of 25° C. to 85° C., in which the resistance of the device is directly proportional to its temperature, so as to limit the temperature of the LED die to under 100° C., and the regulated current enables the LED die to remain in a stable and safe temperature range. Consequently, the LED die is protected from being damaged by overheating, and color distortion caused by temperature dictated color differences is also prevented.

The TCCR device has a characteristic of low resistance before tripping, thereby providing a stable and almost constant current to the LED die. Therefore, variations of the emitted light caused by resistance variations of the LED die can be compensated by the TCCR device. An LED die with current regulated by the TCCR device can emit almost constant light, and provide greater tolerance to accommodate resistance variations caused by the fabrication process of LEDs, so as to improve the production yield of the LEDs.

DETAILED DESCRIPTION OF THE INVENTION

Figure 1:
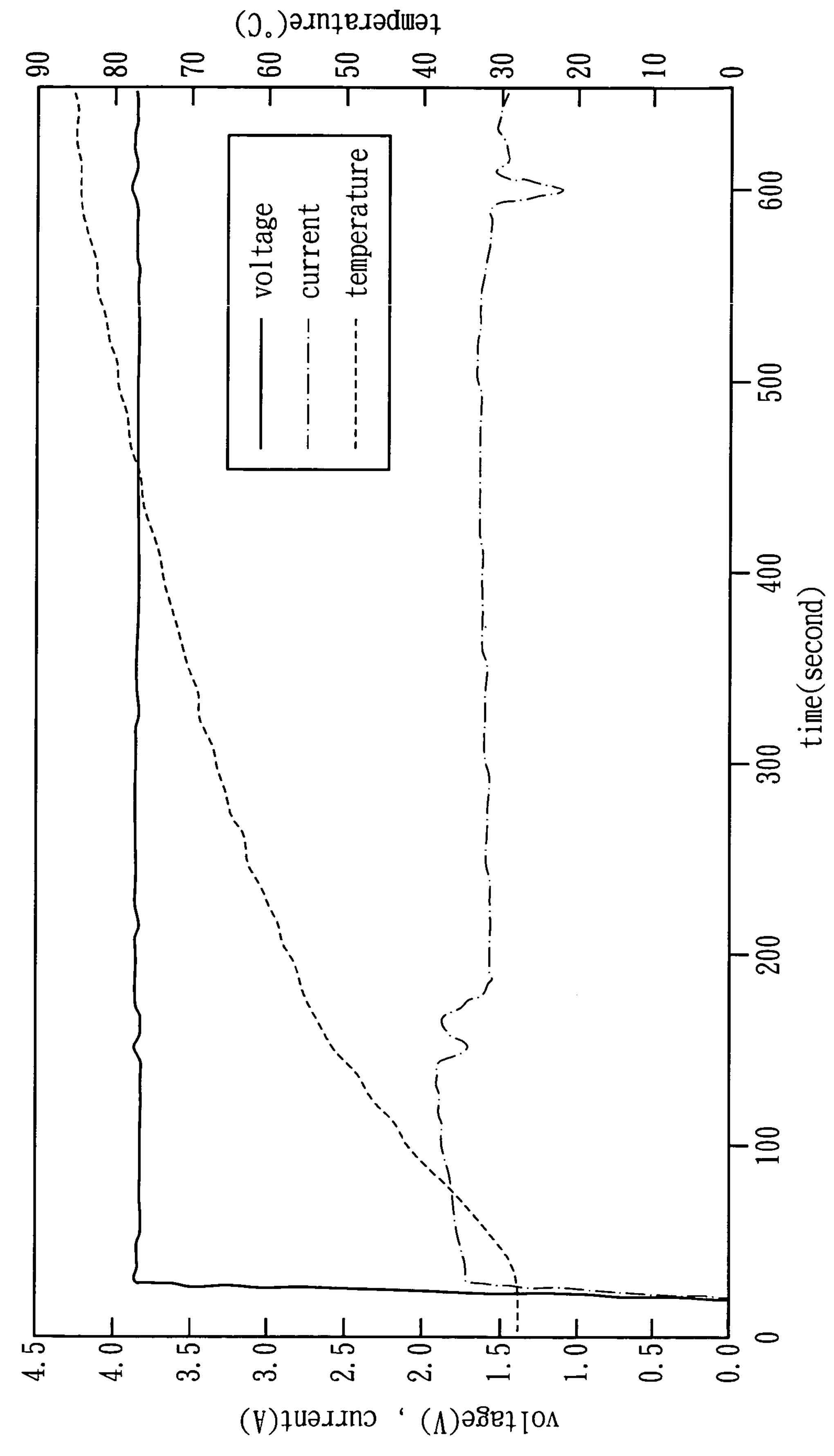
FIG. 1 (Prior Art)
FIG. 1 is a relation diagram of the current, voltage, temperature, and power-on time of a conventional LED die.
Figure 2:
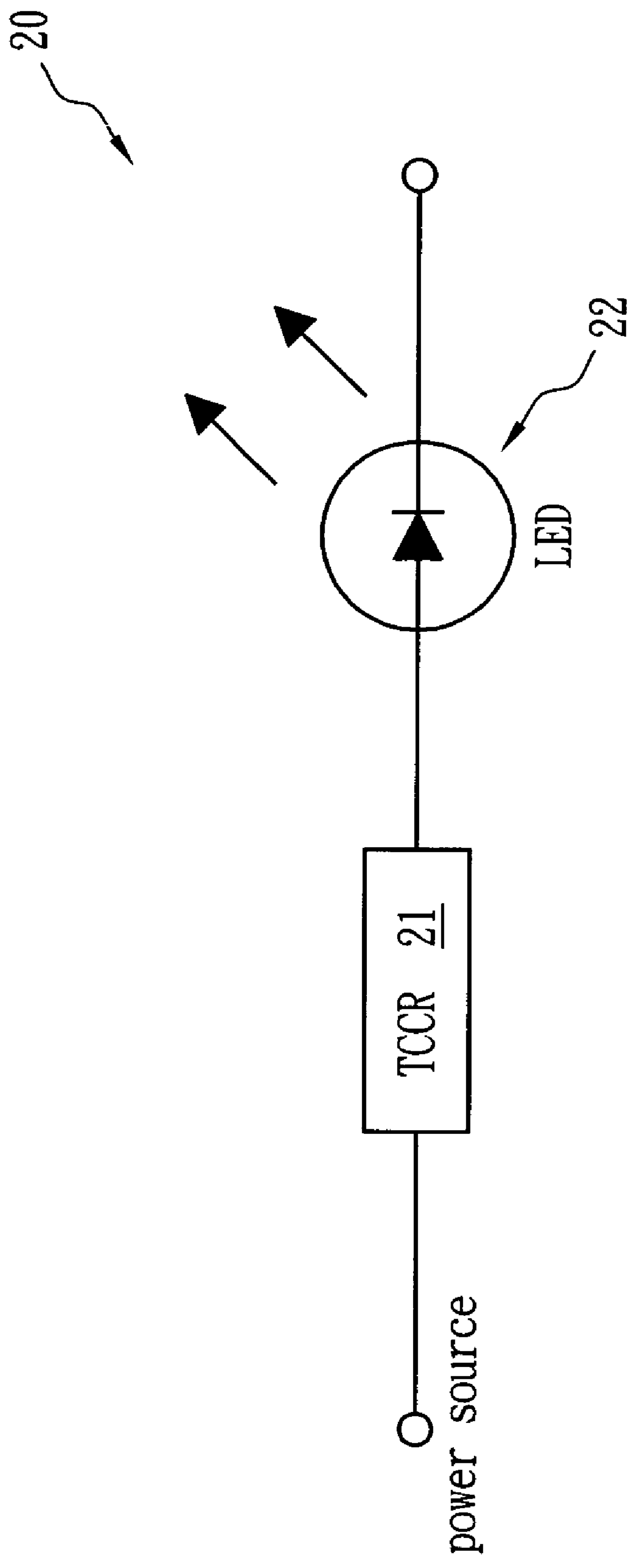
FIG. 2 is a schematic circuit diagram of an LED apparatus according to the first embodiment of the present invention.

Referring to FIG. 2, an LED apparatus 20 of the present invention is formed by connecting a TCCR device 21 and an LED die 22 in series, and the interval between the TCCR device 21 and the LED die 22 is smaller than an effective sensing distance (e.g., 3 cm), such that the TCCR device 21 can effectively sense the temperature of the LED die 22.

Figure 3:
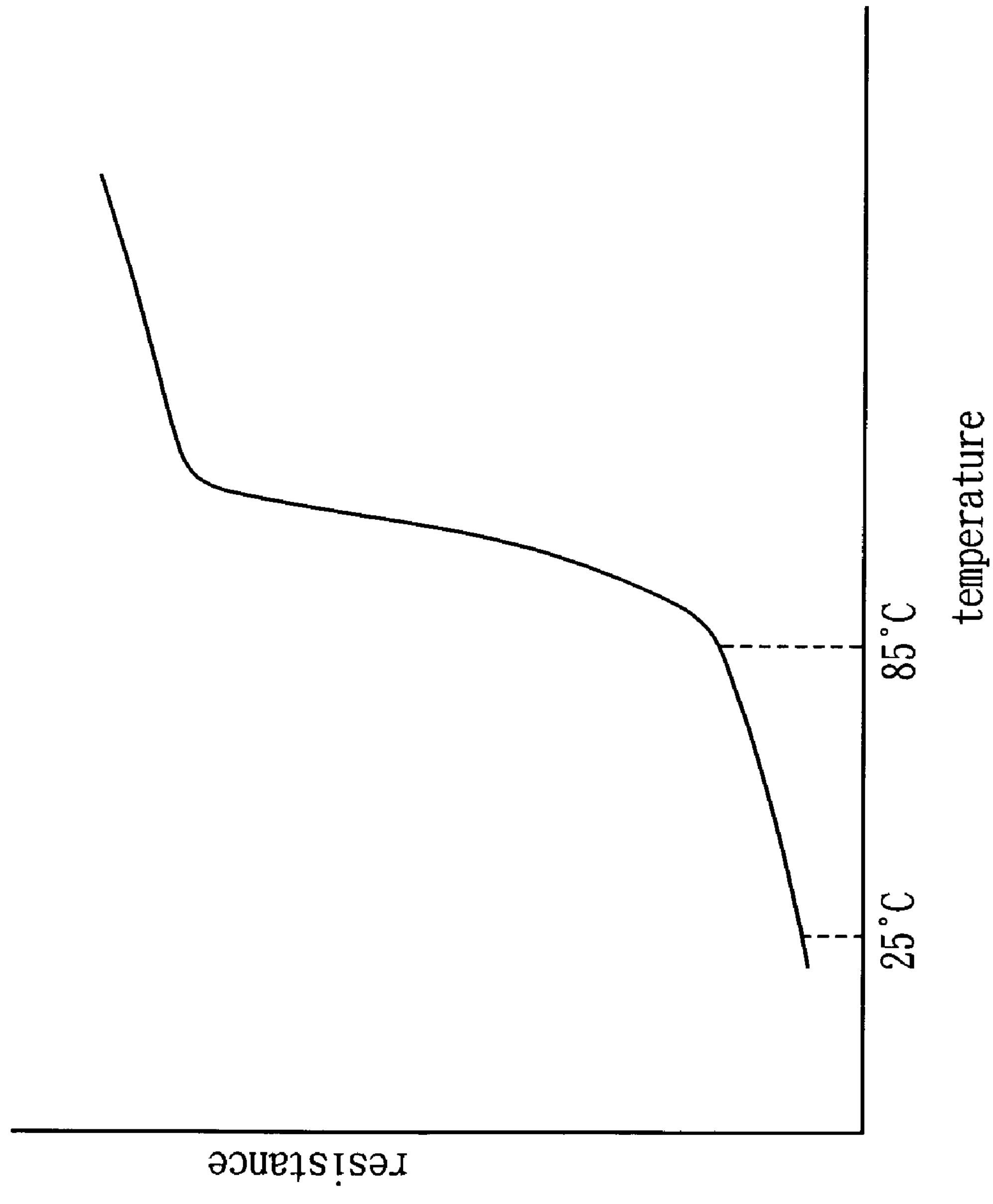
FIG. 3 shows the relation between the temperature and resistance of the TCCR device of the LED apparatus according to the first embodiment of the present invention.

The TCCR device 21 can be a PTC device, and the relationship between the resistance and the temperature of the TCCR device 21 is shown in FIG. 3. The resistance of the TCCR device 21 before tripping is in direct proportion to the temperature (e.g., 25° C.-85° C.) thereof, i.e., the resistance rises nearly linearly with temperature, and the resistance difference is greater than or equal to 100 mΩ when the temperature is between 50° C.-80° C. The resistance of the TCCR device 21 before tripping rises with temperature, so that when the temperature of the serially connected LED die 22 rises while emitting light, the TCCR device 21 will sense the temperature of the LED die 22 and therefore the temperature of the TCCR device 21 increases also. In other words, the resistance of the TCCR device 21 rises accordingly, so that the current flowing through the LED die 22 will decrease.

Figure 4:
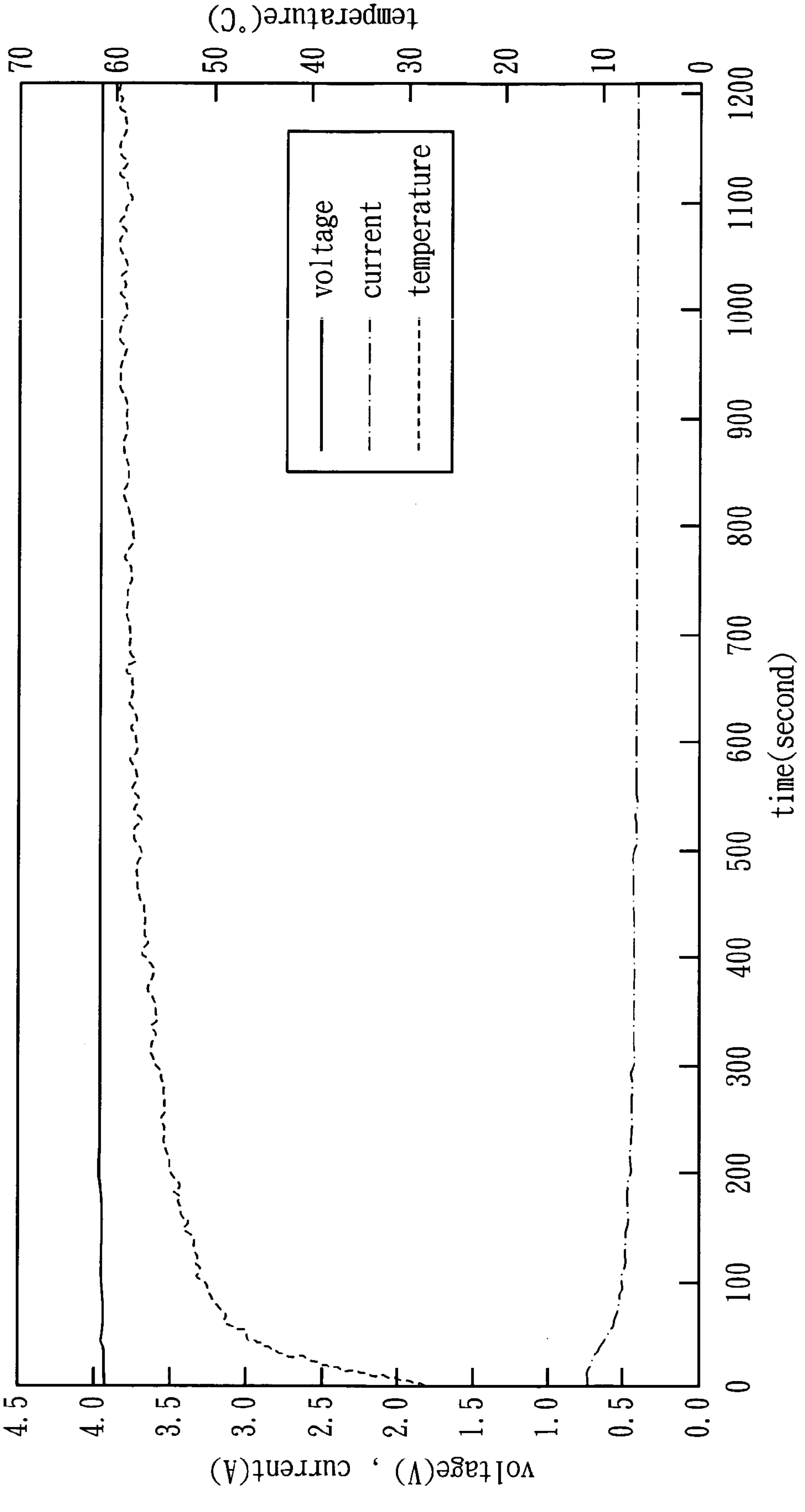
FIG. 4 is a relation diagram of the current, voltage, temperature, and power-on time of the LED die of the LED apparatus according to the first embodiment of the present invention.

FIG. 4 shows the conditions of current, voltage, and temperature of the LED die 22 when an operation voltage of 4V and a current of 1.8 A are applied to the LED apparatus 20. After the voltage and current are applied to the LED die 22, the temperature rises to about 55° C. in 400 seconds after power on. Subsequently, the temperature rises slowly, and remains lower than 60° C. for 20 minutes after power on, and the LED die 22 is almost in thermal equilibrium, i.e., the temperature will not rise continuously. Obviously, after the LED die 22 is serially connected with the TCCR device 21, overheating of the LED die 22 can be effectively avoided.

In detail, after the LED device 22 is powered on for 100 seconds, the temperature increases to about 50° C. Meanwhile, the TCCR device 21 senses the high temperature of the LED device 22, so that the resistance of the TCCR device 21 rises and the current flowing through the LED device 22 is decreased accordingly, e.g., the current is decreased from 0.75 A to about 0.5 A. As the current is reduced, the temperature change of the LED die 22 is slowly augmented, i.e., the temperature is controlled through current regulation.

Figure 5:
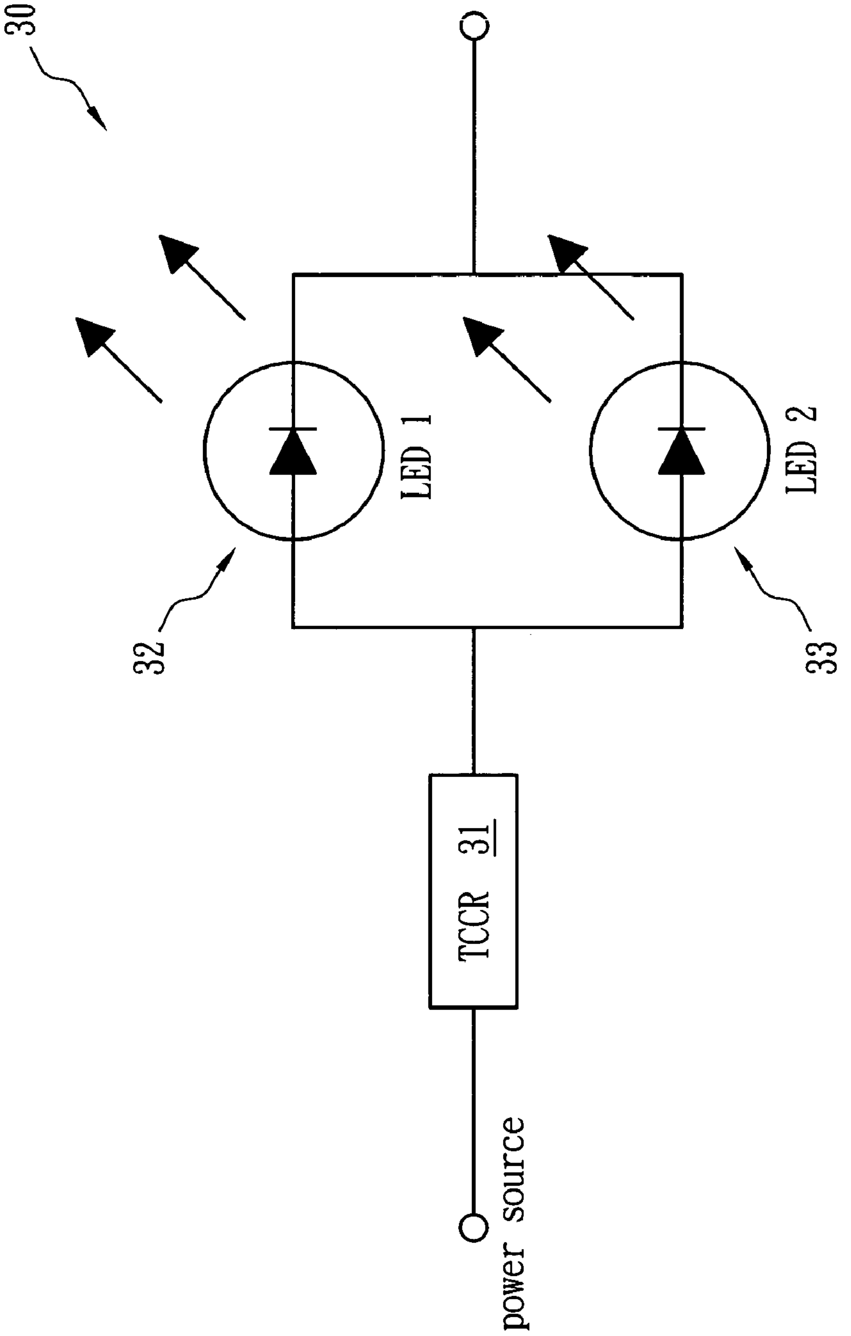
FIG. 5 is a schematic circuit diagram of an LED apparatus according to the second embodiment of the present invention.

FIG. 5 is a schematic circuit diagram of an LED apparatus 30 according to another embodiment of the present invention, which is applicable to a plurality of LED devices. The LED apparatus 30 includes a TCCR device 31, a first LED die 32, and a second LED die 33. The first LED die 32 and the second LED die 33 are first connected in parallel, and then are connected in series with the TCCR device 31.

Figure 6:
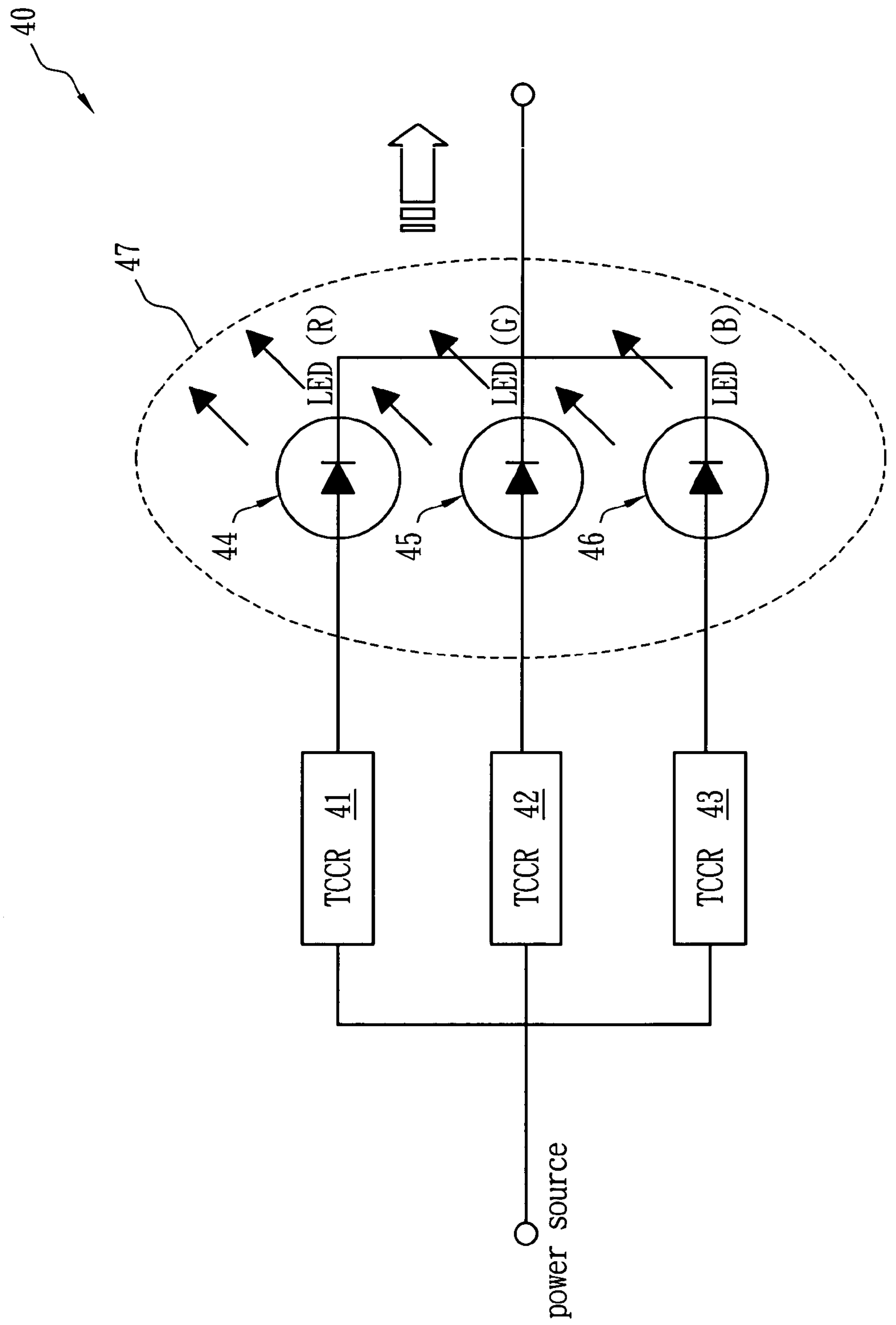
FIG. 6 is a schematic circuit diagram of an LED apparatus according to the third embodiment of the present invention.

FIG. 6 is a schematic circuit diagram of an LED apparatus 40 according to another embodiment of the present invention. The LED apparatus 40 includes a first TCCR device 41, a second TCCR device 42, a third TCCR device 43, a first LED die 44, a second LED die 45, and a third LED die 46. The first LED die 44, the second LED die 45, and the third LED die 46 are red (R), green (G), and blue (B) LED dies, respectively. The first LED die 44, the second LED die 45, and the third LED die 46 are connected in parallel to each other and are connected in series to the first TCCR device 41, the second TCCR device 42, and the third TCCR device 43, respectively. The first LED die 44, the second LED die 45, and the third LED die 46 emit light of red, green, and blue, respectively, so an LED light-emitting module 47 composed of them can regulate the three LED dies to emit light of required colors.

In the above embodiments, the LED dies are all connected in series to the TCCR devices, so the LED apparatuses composed thereof have the functions of temperature control and current regulation. In addition, the TCCR device also controls or prevents the following abnormal conditions: (1) Input currents much higher than the rated current of the LED die; (2) Input voltages much higher than the rated voltage of the LED die; (3) Abrupt temperature increase of the LED die; and (4) Surge of electrical current.

The above-described embodiments of the present invention are intended to be illustrative only. Numerous alternative embodiments may be devised by those skilled in the art without departing from the scope of the following claims.

What is claimed is:

1. A light emitting diode (LED) apparatus, comprising:

a LED die having a die temperature; and a temperature control and current regulation (TCCR) device electrically coupled in series between the LED die and a power source, and disposed within about 3 cm from the LED die and adapted to sense the die temperature, the TCCR device exhibiting positive temperature coefficient behaviors and having a TCCR resistance adapted to regulate a current from the power source provided to the LED die when the die temperature is in a range of between about 25° C. and about 85° C. and below a trip temperature of the TCCR device, such that:

when the die temperature increases, the TCCR device senses the die temperature and thereby increases the TCCR resistance operating in a range of between about 25° C. and about 85° C., thereby decreasing the current flowing through the LED die and decreasing a rate at which the die temperature increases.

2. The LED apparatus in accordance with claim 1, further comprising two LED dies connected in parallel.

3. The LED apparatus in accordance with claim 1, further comprising three LED dies which emit red, green, and blue light, respectively.

4. The LED apparatus in accordance with claim 3, further comprising first, second and third TCCR devices, wherein the red, green, and blue LED dies are respectively connected to the first, second and third TCCR devices in series.

5. A light emitting diode (LED) apparatus, comprising:

a LED die having a die temperature; and a temperature control and current regulation (TCCR) device electrically coupled in series between the LED die and a power source and disposed within an effective distance of the LED die to sense the die temperature, the TCCR device exhibiting positive temperature coefficient behaviors and having a TCCR resistance adapted to regulate a current from the power source provided to the LED die when the die temperature is in a range of between about 25° C. and about 85° C. and below a trip temperature of the TCCR device, such that when the die temperature increases, the TCCR device senses the die temperature and thereby increases the TCCR resistance operating in a range of between about 25° C. and about 85° C., thereby decreasing the current flowing through the LED die and decreasing a rate at which the die temperature increases.

* * * * *